(12) United States Patent
Fukuda et al.

(10) Patent No.: US 6,323,538 B1
(45) Date of Patent: Nov. 27, 2001

(54) BIPOLAR TRANSISTOR AND METHOD FOR FABRICATING THE SAME

(75) Inventors: Takeshi Fukuda; Daisuke Ueda, both of Osaka; Kaoru Inoue, Shiga; Katsunori Nishii, Osaka; Toshinobu Matsuno, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/480,942

(22) Filed: Jan. 11, 2000

(30) Foreign Application Priority Data

Jan. 12, 1999 (JP) .................................................. 11-005001

(51) Int. Cl.$^7$ ................................................. H01L 27/082
(52) U.S. Cl. ........................ 257/565; 257/578; 257/588; 257/592; 257/563; 257/564; 257/561; 257/560; 257/526; 257/386; 257/557
(58) Field of Search .................................... 257/565, 588, 257/592, 578, 563, 564, 561, 560, 526, 386, 557; 438/342, 338, 309

(56) References Cited

U.S. PATENT DOCUMENTS

| | | | |
|---|---|---|---|
| 4,712,125 | * | 12/1987 | Bhatia et al. ........................... 357/59 |
| 5,024,957 | * | 6/1991 | Harame et al. ......................... 437/31 |
| 5,039,622 | * | 8/1991 | Ishihara ................................. 437/41 |
| 5,049,964 | * | 9/1991 | Sakai et al. ............................. 357/34 |
| 5,258,642 | * | 11/1993 | Nakamura ............................. 257/514 |
| 5,541,124 | * | 7/1996 | Miwa et al. ............................ 437/31 |
| 5,548,155 | * | 8/1996 | Yoshihara ............................. 257/517 |
| 5,624,854 | | 4/1997 | Taft et al. . |
| 5,654,211 | * | 8/1997 | Ham ..................................... 438/367 |
| 5,798,561 | * | 8/1998 | Sato ..................................... 257/588 |
| 5,886,395 | * | 3/1999 | Katsumata et al. ................... 257/585 |
| 5,915,186 | * | 6/1999 | Gomi .................................... 438/313 |
| 5,939,749 | * | 8/1999 | Taketa et al. ......................... 257/316 |
| 6,117,744 | * | 9/2000 | Ammo ................................. 438/309 |

FOREIGN PATENT DOCUMENTS

05074789 * 3/1993 (JP) .
5-182978    7/1993 (JP) .
05182978 * 7/1993 (JP) .

* cited by examiner

Primary Examiner—Eddie Lee
Assistant Examiner—Eugene Lee
(74) Attorney, Agent, or Firm—Eric J. Robinson; Nixon Peabody LLP

(57) ABSTRACT

An n-type first single crystal silicon layer is provided as collector region over a silicon substrate with a first insulating film interposed therebetween. A p-type first polysilicon layer is provided as an extension of a base region over the first single crystal silicon layer with a second insulating film interposed therebetween. A p-type second single crystal silicon layer is provided as intrinsic base region on a side of the first single crystal silicon layer, second insulating film and first polysilicon layer. An n-type third single crystal silicon layer is provided as emitter region on a side of the second single crystal silicon layer. And an n-type third polysilicon layer is provided on the first insulating film as extension of an emitter region and is connected to a side of the third single crystal silicon layer.

4 Claims, 3 Drawing Sheets

BIPOLAR TRANSISTOR AND METHOD FOR FABRICATING THE SAME

BACKGROUND OF THE INVENTION

The present invention relates to a bipolar transistor with a base region extending vertically to the surface of a semiconductor substrate and to a method for fabricating such a transistor.

A bipolar transistor operating at even higher speeds is in high demand to further improve the performance of a semi-conductor integrated circuit device.

Reduction in base-emitter or base-collector parasitic capacitance plays a key role in increasing the operating speed of a bipolar transistor. To minimize the parasitic capacitance, a junction region between the base and emitter regions or between the base and collector regions should preferably have its area reduced.

For that purpose, the base-emitter or base-collector junction region is formed by lithography according to a known technique to make its area as small as possible.

When the lithography technique is adopted, however, the precision of fine-line processing is dependent on the wavelength of radiation emitted from a light source for the lithographic process. In other words, it is difficult to define a fine-line pattern at a precision equal to or smaller than the wavelength of the radiation. Thus, the area of the junction region cannot be reduced below a certain limit.

Japanese Laid-Open Publication No. 5-182978 discloses an alternative method for reducing the base-emitter or base collector junction area.

Hereinafter, the method for fabricating a bipolar transistor as disclosed in the publication identified above will be described with reference to FIGS. 3(a) through 3(d).

First, as shown in FIG. 3(a), a silicon-on-insulator (SOI) substrate is prepared. In the SOI substrate, an n-type first single crystal silicon layer 102 is formed over a silicon substrate 100 with a first silicon dioxide film 101 interposed therebetween. Next, the first single crystal silicon layer 102 is selectively doped with As ions, thereby defining a collector connection region 103. In this case, the first single crystal silicon layer 102 will be a collector region. Then, a second silicon dioxide film 104 is deposited by a CVD process on the first single crystal silicon layer 102 and collector connection region 103, and a p-type first polysilicon layer 105 is deposited by a CVD process on the second silicon dioxide film 104.

Next, as shown in FIG. 3(b), an opening 106 is provided through the first polysilicon layer 105, second silicon dioxide film 104 and first single crystal silicon layer 102. The opening 106 is provided to form a transistor thereon. Subsequently, an epitaxy process is performed under the conditions so defined as to grow epitaxial and polysilicon layers at the same time. As a result of this process, a p-type second single crystal silicon layer 107 is formed on the side faces of the first single crystal silicon layer 102. Also, a p-type second polysilicon layer 108 is deposited to cover the upper and side faces of the first polysilicon layer 105, the side faces of the second silicon dioxide film 104 and the upper surface of the first silicon dioxide film 101. Then, the layers 107 and 108 are etched anisotropically, thereby leaving the p-type second single crystal silicon layer 107 on the side faces of the first single crystal silicon layer 102 and the second polysilicon layer 108 on the side faces of the first polysilicon layer 105 and second silicon dioxide film 104, respectively. The second single crystal silicon layer 107 will be an intrinsic base region, while the first and second polysilicon layers 105 and 108 will together constitute a base connection region.

Then, a resist pattern is defined over the entire surface of the first polysilicon layer 105 and then etched under controlled conditions, thereby partially leaving the resist pattern 109 inside the opening 106 where an emitter region will be defined as shown in FIG. 3(c). Subsequently, a third silicon dioxide film 110 is deposited on parts of the first and second polysilicon layers 105 and 108 that are not covered with the resist pattern 109.

Thereafter, as shown in FIG. 3(d), the resist pattern 109 is stripped. Then, an n-type third single crystal silicon layer 111 is formed on the side faces of the second single crystal silicon layer 107 (i.e., the exposed inner wall of the opening 106 that is not covered with the third silicon dioxide film 110). The third single crystal silicon layer 111 will be an emitter region. Subsequently, an n-type third polysilicon layer 112 is deposited over the entire surface of the third silicon dioxide film 110 as well as over the inner wall of the opening 106, and then patterned. The patterned third polysilicon layer 112 will be an emitter connection region.

Next, the third silicon dioxide film 110 and the first polysilicon layer 105 are patterned, and then the second silicon dioxide film 104 is patterned. Thereafter, openings are provided in the third silicon dioxide film 110 to form electrodes thereon. Subsequently, an aluminum film is deposited over the collector connection region 103, second and third silicon dioxide films 104, 110 and third polysilicon layer 112 and then patterned. As a result, emitter, base and collector electrodes 114A, 114B and 114C are formed to be connected to the third polysilicon layer 112, first polysilicon layer 105 and collector connection regions 103, respectively. In this manner, the prior art bipolar transistor is completed.

In the prior art bipolar transistor, the area of the junction between the first and second single crystal silicon layers 102 and 107 functioning as the collector and intrinsic base regions is defined by the thickness of the first single crystal silicon layer 102. Thus, the base-collector parasitic capacitance can be reduced if the first single crystal silicon layer 102 is thinned. Also, the area of the junction between the second and third single crystal silicon layers 107 and 111, which function as the intrinsic base and emitter regions, respectively, is defined by the height of the third single crystal silicon layer 111, or the thickness of the resist pattern 109 left inside the opening 106. Thus, the base-emitter parasitic capacitance can be reduced if the resist pattern 109 left within the opening 106 is thinned.

In the prior art bipolar transistor, however, it is difficult to precisely control the thickness of the resist pattern 109 left within the opening 106. This is because the resist pattern 109 is defined by etching the resist pattern that has been deposited over the entire surface of the first polysilicon layer 105 under controlled conditions.

For that reason, it is also difficult to precisely control the height of the third single crystal silicon layer 111, or the area of the base-emitter junction region. As a result, the base-emitter parasitic capacitance becomes variable, thus making the electrical characteristics of the bipolar transistor inconstant.

SUMMARY OF THE INVENTION

An object of the present invention is increasing the operating speed of a bipolar transistor by lowering the base-collector and base-emitter parasitic capacitance values through the reduction in area of base-collector and base-emitter junction regions.

Another object of the present invention is stabilizing the electrical characteristics of the bipolar transistor by precisely controlling the base-emitter junction area or parasitic capacitance.

To achieve these objects, a bipolar transistor according to the present invention includes: a first semiconductor layer of a first conductivity type, which is formed over a semiconductor substrate; a second semiconductor layer of a second conductivity type, which is formed over the first semiconductor layer with an insulating film interposed therebetween; a third semiconductor layer of the second conductivity type, which is formed on side faces of the first and second semiconductor layers and the insulating film; a fourth semiconductor layer of the first conductivity type, which is formed on a side of the third semiconductor layer, the side being opposite to the other side of the third semiconductor layer that is in contact with the first and second semiconductor layers; and a fifth semiconductor layer of the first conductivity type, which is formed over the semiconductor substrate to be in contact with the fourth semiconductor layer. The third semiconductor layer is defined as a base region. The first semiconductor layer is defined as one of collector and emitter regions, while the fourth semiconductor layer is defined as the other of the collector and emitter regions. The second semiconductor layer is defined as an extension of the third semiconductor layer. And the fifth semiconductor layer is defined as an extension of the fourth semiconductor layer.

A method for fabricating a bipolar transistor according to the present invention includes the steps of: forming a first semiconductor layer of a first conductivity type, an insulating film and a second semiconductor layer of a second conductivity type in this order over a semiconductor substrate; forming a third semiconductor layer of the second conductivity type on respective side faces of the first and second semiconductor layers and the insulating film; forming a fourth semiconductor layer of the first conductivity type on a side of the third semiconductor layer, the side being opposite to the other side of the third semiconductor layer that is in contact with the first and second semiconductor layers; forming a fifth semiconductor layer of the first conductivity type over the semiconductor substrate such that the fifth semiconductor layer is in contact with the fourth semiconductor layer; and defining the third semiconductor layer as a base region, the first semiconductor layer as one of collector and emitter regions, the fourth semiconductor layer as the other of the collector and emitter regions, the second semiconductor layer as an extension of the third semiconductor layer and the fifth semiconductor layer as an extension of the fourth semiconductor layer, respectively.

According to the present invention, the area of a junction region between the fourth semiconductor layer to be collector or emitter region and the third semiconductor layer to be base region is defined by the height of the third semiconductor layer. Also, since the third semiconductor layer is formed on the respective side faces of the first and second semiconductor layers and the insulating film, the height of the third semiconductor layer is defined as a total thickness of the first and second semiconductor layers and the insulating film. And the thicknesses of the first and second semiconductor layers and the insulating film are each controllable precisely. Thus, the area of the collector-base or emitter-base junction region is controllable precisely, so is the collector-base or emitter-base parasitic capacitance. As a result, the electrical characteristics of the bipolar transistor can be stabilized.

In addition, the thicknesses of the first and second semiconductor layers and the insulating film can all be reduced by adjusting the deposition conditions. Thus, the operating speed of the bipolar transistor can be increased by reducing the collector-base or emitter-base parasitic capacitance through the reduction in total thickness of the first and second semiconductor layers and the insulating film.

In one embodiment of the present invention, the area of the second semiconductor layer is preferably smaller than that of the first semiconductor layer.

In such an embodiment, an extension electrode can be formed to be in direct contact with the first semiconductor layer. That is to say, there is no need to provide any extension region for the first semiconductor layer separately, thus cutting down the number of necessary process steps.

In another embodiment, the first and fourth semiconductor layers are preferably silicon layers, while the third semiconductor layer is preferably a silicon germanium layer.

The band gap of a silicon germanium layer is smaller than that of a silicon layer. Thus, discontinuity is caused between the valence band of the first and fourth semiconductor layers and that of the third semiconductor layer in such an embodiment. As a result, the number of holes injected from the base region into the emitter region decreases and therefore, the frequency characteristics of the bipolar transistor improve.

In still another embodiment, the fourth and fifth semiconductor layers are preferably formed in a single process step. In such an embodiment, increase in number of process steps can be minimized by doing so.

DESCRIPTION OF THE PREFERRED EMBODIMENTS

Hereinafter, a bipolar transistor according to an exemplary embodiment of the present invention will be described with reference to FIG. 1.

Figure 1:
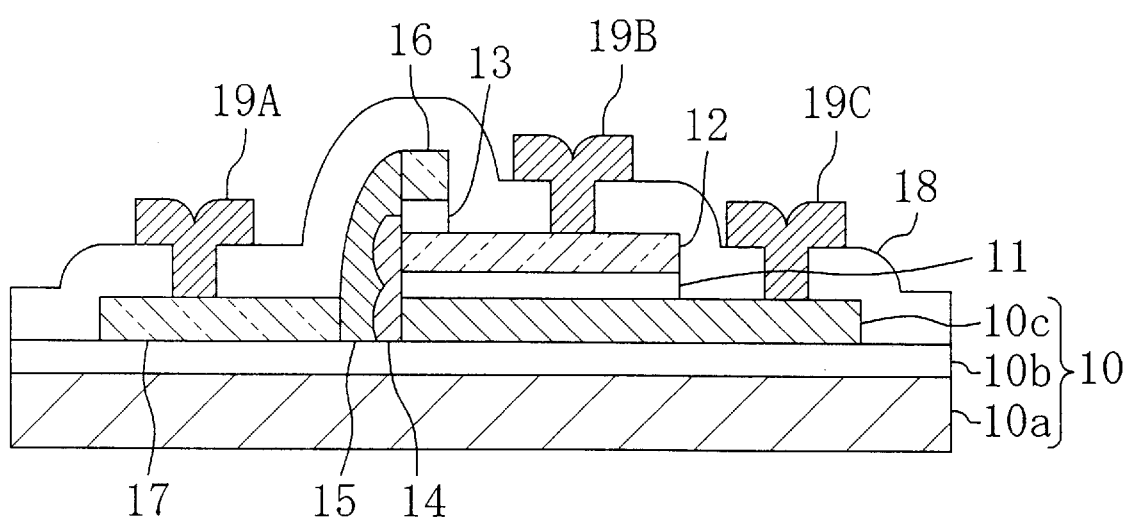
FIG. 1 is a cross-sectional view of a bipolar transistor according to an exemplary embodiment of the present invention.

As shown in FIG. 1, an n-type first single crystal silicon layer (i.e., first semiconductor layer) 10c doped with arsenic (As) is provided over a silicon substrate 10a with a first insulating film 10b of silicon dioxide interposed therebetween. The silicon substrate 10a, first insulating film 10b and first single crystal silicon layer 10c together constitute an SOI substrate 10. The first single crystal silicon layer 10c is defined as collector region.

A p-type first polysilicon layer (i.e., second semiconductor layer) 12 doped with boron (B) is provided over the first single crystal silicon layer 10c with a second insulating film 11 of silicon dioxide interposed therebetween. The thickness of the second insulating film 11 may be 100 nm. The first polysilicon layer 12 is defined as an extension of an intrinsic base region as will be described later.

A p-type second single crystal silicon layer (i.e., third semiconductor layer) 14 with a thickness of 60 nm is provided on one side of the first single crystal silicon layer 10c, second insulating film 11 and first polysilicon layer 12. The second single crystal silicon layer 14 is defined as intrinsic base region. An n-type third single crystal silicon layer (i.e., fourth semiconductor layer) 15 is provided to cover the second single crystal silicon layer 14 on a side of the layer 14, which is opposite to the other side thereof in contact with the first single crystal silicon layer 10c and the first polysilicon layer 12. An n-type second polysilicon layer 16 is provided over the first polysilicon layer 12 with a third insulating film 13 of silicon dioxide interposed therebetween. The second polysilicon layer 16 is located over one end of the first polysilicon layer 12 and connected to the third single crystal silicon layer 15. The third single crystal silicon layer 15 and the second polysilicon layer 16 together constitute an emitter region. An n-type third polysilicon layer 17 is further provided on the first insulating film 10b to extend along the first insulating film 10b. One end of the third polysilicon layer 17 is connected to the side of the third single crystal silicon layer 15. The third polysilicon layer 17 is defined as extension of the emitter region.

A fourth insulating film 18 of silicon dioxide is further provided to cover the first and third single crystal silicon layers 10c and 15 and the first, second and third polysilicon layers 12, 16 and 17. And emitter, base and collector electrodes 19A, 19B and 19C are provided on the fourth insulating film 18 so as to be connected to the third polysilicon layer (emitter extension region) 17, the first polysilicon layer (base extension region) 12 and first single crystal silicon layer (collector region) 10c, respectively.

Hereinafter, a method for fabricating the bipolar transistor will be described with reference to FIGS. 2(a) through 2(d).

Figure 2A:
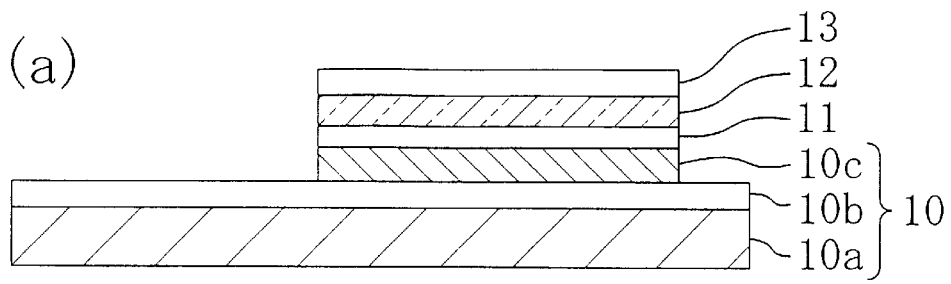
FIGS. 2(a) through 2(d) are cross-sectional views illustrating respective process steps for fabricating the bipolar transistor according to the present invention.

First, as shown in FIG. 2(a), the SOI substrate 10 is prepared. In the SOI substrate, the n-type first single crystal silicon layer (first semiconductor layer) 10c has been deposited over the silicon substrate 10a with the first insulating film 10b of silicon dioxide interposed therebetween. The first single crystal silicon layer 10c, which will constitute a collector region, may be doped with As and have a resistivity of 0.3 Ω·cm. Alternatively, the n-type first single crystal silicon layer 10c may be newly deposited over the silicon substrate 10a with the first insulating film 10b interposed therebetween in the fabrication process of the bipolar transistor.

Next, the second insulating film 11 of silicon dioxide is deposited by a chemical vapor deposition (CVD) process to a thickness of 100 nm on the first single crystal silicon layer 10c of the SOI substrate 10. Then, the p-type first polysilicon layer (second semiconductor layer) 12, which is doped with B at a carrier density of $1\times10^{20}/cm^3$, is deposited by a CVD process again to a thickness of 300 nm on the second insulating film 11. The first polysilicon layer 12 will be an extension region for the intrinsic base region that will be formed later.

Subsequently, the third insulating film 13 of silicon dioxide is deposited by a CVD process, for example, to a thickness of 300 nm on the first polysilicon layer 12. Thereafter, a first resist pattern (not shown) is defined on the third insulating film 13. And the third insulating film 13, first polysilicon layer 12, second insulating film 11 and first single crystal silicon layer 10c are etched and patterned anisotropically using the first resist pattern as a mask.

Figure 2B:
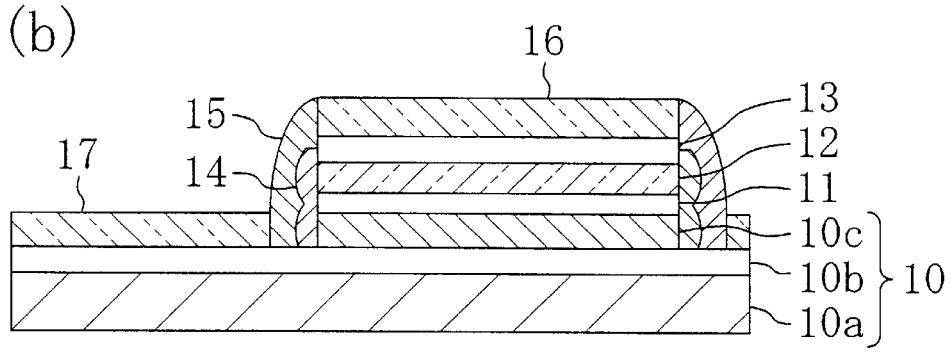

Then, as shown in FIG. 2(b), the p-type second single crystal silicon layer (third semiconductor layer) 14 is selectively grown epitaxially by a CVD process to a thickness of 60 nm on the side faces of the first single crystal silicon layer 10c, second insulating film 11 and first polysilicon layer 12. The second single crystal silicon layer 14 will be the intrinsic base region.

Next, an epitaxy process is performed under such conditions as growing epitaxial and polysilicon layers at the same time. In this manner, the n-type third single crystal silicon layer (fourth semiconductor layer) 15 is grown on the side of the second single crystal silicon layer 14. Also, the n-type second polysilicon layer 16 is grown on the third insulating film 13 so as to be connected to the third single crystal silicon layer 15. Furthermore, the n-type third polysilicon layer (fifth semiconductor layer) 17 is grown on the first insulating film 10b so as to be also connected to the third single crystal silicon layer 15. The third single crystal silicon layer 15 will be the emitter region, while the third polysilicon layer 17 will be the emitter extension region.

Figure 2C:
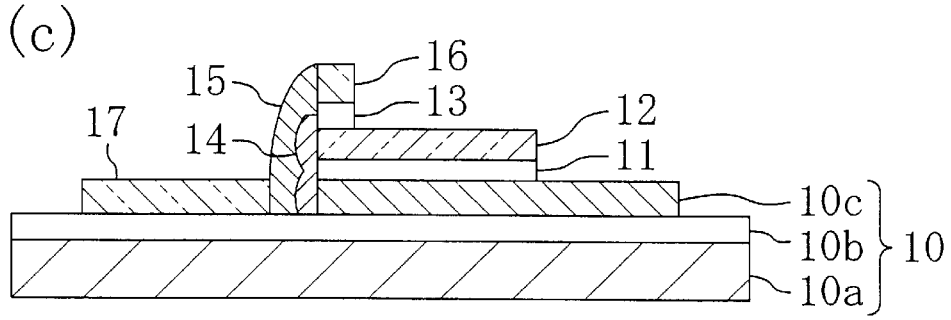

Then, as shown in FIG. 2(c), the second polysilicon layer 16 and third insulating film 13 are etched and patterned anisotropically using a second resist pattern (not shown) as a mask. Thereafter, the first polysilicon layer 12 and second insulating film 11 are etched and patterned anisotropically using a third resist pattern (not shown) as a mask. Subsequently, the first single crystal silicon layer 10c and third polysilicon layer 17 are etched and patterned anisotropically using a fourth resist pattern (not shown) as a mask.

Figure 2D:
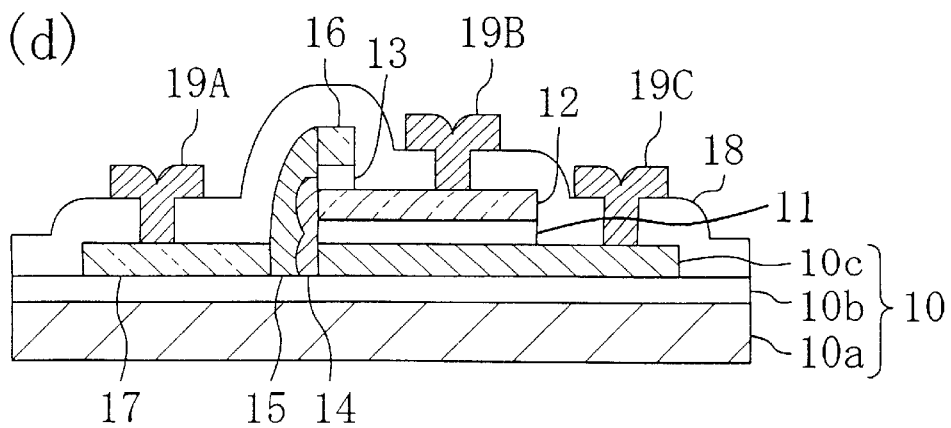
Figure 3A:
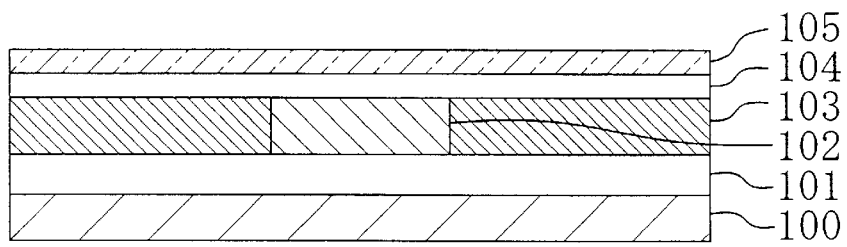
FIGS. 3(a) through 3(d) are cross-sectional views illustrating respective process steps for fabricating a prior art bipolar transistor.
Figure 3B:
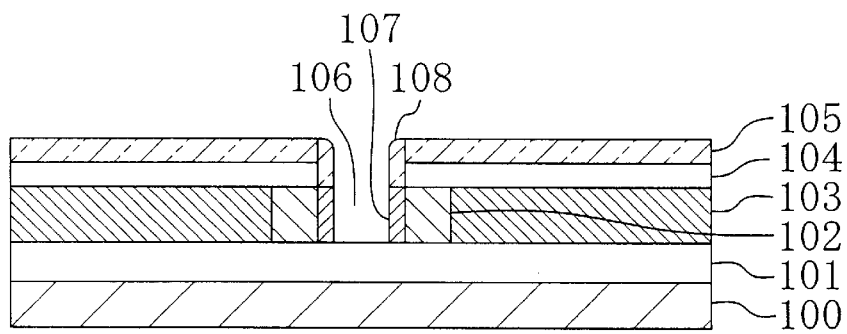
Figure 3C:
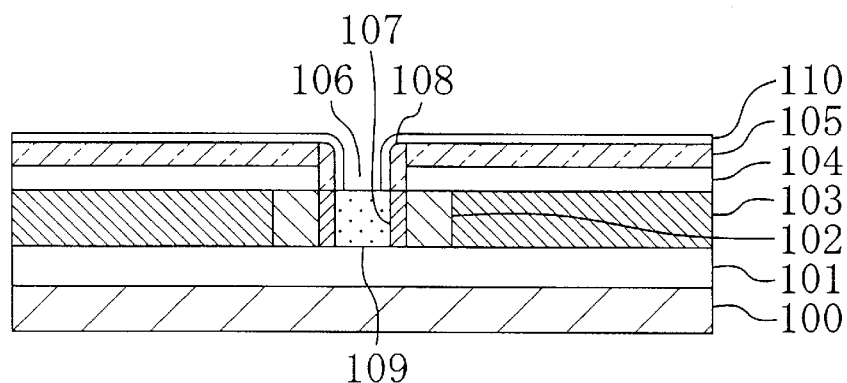
Figure 3D:
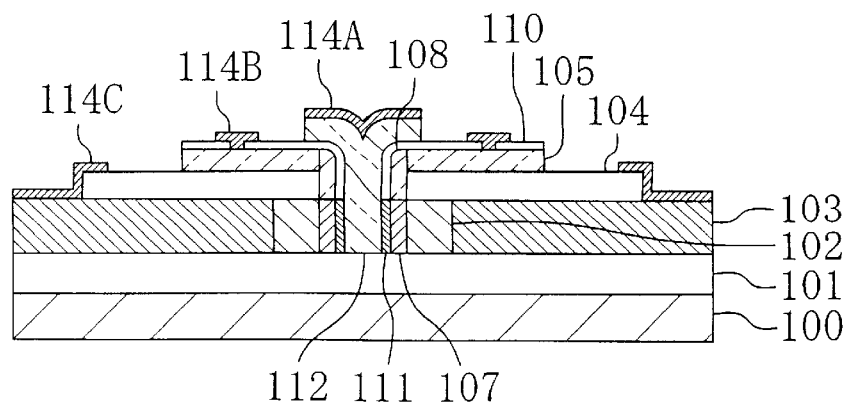

Thereafter, as shown in FIG. 2(d), the fourth insulating film 18 of silicon dioxide is deposited by a CVD process over the entire surface of the substrate. Then, electrode openings are provided in the fourth insulating film 18 by etching anisotropically the fourth insulating film 18 using a fifth resist pattern (not shown) as a mask. Next, an aluminum film, for example, is deposited over the entire surface of the fourth insulating film 18 and then patterned, thereby forming the emitter, base and collector electrodes 19A, 19B and 19C. In this manner, the inventive npn junction bipolar transistor is obtained.

According to the present invention, the height of the second single crystal silicon layer 14 to be the base region is defined as the total thickness of the first single crystal silicon layer 10c, second insulating film 11 and first polysilicon layer 12. And the thicknesses of the first single crystal silicon layer 10c, second insulating film 11 and first polysilicon layer 12 are each controllable precisely. Also, the area of a junction region between the third single crystal silicon layer 15 to be the emitter region and the second single crystal silicon layer 14 to be the base region is defined by the height of the second single crystal silicon layer 14.

Thus, the area of the emitter-base junction region is controllable precisely, so is the emitter-base parasitic capacitance. As a result, the electrical characteristics of the bipolar transistor can be stabilized.

In addition, the thicknesses of the first single crystal silicon layer 10c, second insulating film 11 and first polysilicon layer 12 can all be reduced by adjusting the deposition conditions. Accordingly, the operating speed of the bipolar transistor can be increased by reducing the emitter-base parasitic capacitance through the reduction in total thickness of the first single crystal silicon layer 10c, second insulating film 11 and first polysilicon layer 12.

Moreover, the first single crystal silicon layer 10c is patterned after the first polysilicon layer 12 has been patterned. Accordingly, the area of the first polysilicon layer 12 can be smaller than that of the first single crystal silicon layer 10c. That is to say, the collector electrode 19C can be directly connected to the first single crystal silicon layer 10c, thus cutting down the number of process steps.

In the foregoing embodiment, the intrinsic base region is made of the p-type second single crystal silicon layer 14. Alternatively, the base region may be made of p-type silicon germanium. The band gap of the silicon germanium layer is smaller than that of the silicon layer. Thus, discontinuity is caused between the valence band of the first and third single crystal silicon layers 10c and 15 functioning as the collector and emitter regions and that of the intrinsic base region in such an embodiment. As a result, the number of holes injected from the base region into the emitter region decreases and the frequency characteristics of the bipolar transistor improve.

Also, in the foregoing embodiment, the first and third single crystal silicon layers 10c and 15 are defined as collector and emitter regions, respectively. Alternatively, the first and third single crystal silicon layers 10c and 15 may be defined as emitter and collector regions, respectively. In such a case, the third polysilicon layer 17 will be a collector extension region.

Furthermore, the present invention has been described as being applied to an npn junction bipolar transistor and a method for fabricating the same. Alternatively, the present invention is naturally applicable to a pnp junction bipolar transistor.

What is claimed is:

1. A bipolar transistor comprising:

a first semiconductor layer of a first conductivity type, which is formed over a semiconductor substrate;

a second semiconductor layer of a second conductivity type, which is formed over the first semiconductor layer with an insulating film interposed therebetween;

a third semiconductor layer of the second conductivity type, which is formed on side faces of the first and second semiconductor layers and the insulating film;

a fourth semiconductor layer of the first conductivity type, which is formed on a side of the third semiconductor layer, the side being opposite to the other side of the third semiconductor layer that is in contact with the first and second semiconductor layers; and a fifth semiconductor layer of the first conductivity type, which is formed over the semiconductor substrate to be in contact with the fourth semiconductor layer, wherein the third semiconductor layer is defined as a base region, and wherein the first semiconductor layer is defined as one of collector and emitter regions, and wherein the fourth semiconductor layer is defined as the other of the collector and emitter regions, and wherein the second semiconductor layer is defined as an extension of the third semiconductor layer, and wherein the fifth semiconductor layer is defined as an extension of the fourth semiconductor layer.

2. The bipolar transistor of claim 1, wherein the area of the second semiconductor layer is smaller than that of the first semiconductor layer.

3. The bipolar transistor of claim 1, wherein the first and fourth semiconductor layers are silicon layers, and wherein the third semiconductor layer is a silicon germanium layer.

4. The bipolar transistor of claim 1, wherein the fourth and fifth semiconductor layers are formed in a single process step.

* * * * *